US009390922B1

(12) United States Patent
Sakurai

(10) Patent No.: US 9,390,922 B1
(45) Date of Patent: Jul. 12, 2016

(54) PROCESS FOR FORMING WIDE AND NARROW CONDUCTIVE LINES

(71) Applicant: SanDisk Technologies Inc., Plano, TX (US)

(72) Inventor: Takuya Sakurai, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/616,219

(22) Filed: Feb. 6, 2015

(51) Int. Cl.
  *H01L 21/033* (2006.01)
  *H01L 21/308* (2006.01)
  *H01L 21/02* (2006.01)
  *H01L 27/115* (2006.01)

(52) U.S. Cl.
  CPC ...... *H01L 21/0337* (2013.01); *H01L 21/02532* (2013.01); *H01L 21/02664* (2013.01); *H01L 21/3086* (2013.01); *H01L 27/11517* (2013.01); *H01L 27/11563* (2013.01)

(58) Field of Classification Search
  None
  See application file for complete search history.

(56) References Cited

U.S. PATENT DOCUMENTS

| | | | |
|---|---|---|---|
| 5,570,315 A | 10/1996 | Tanaka et al. | |
| 5,768,192 A | 6/1998 | Eitan | |
| 5,774,397 A | 6/1998 | Endoh et al. | |
| 5,887,145 A | 3/1999 | Harari et al. | |
| 6,011,725 A | 1/2000 | Eitan | |
| 6,046,935 A | 4/2000 | Takeuchi et al. | |
| 6,429,123 B1 | 8/2002 | Tseng | |
| 6,894,341 B2 | 5/2005 | Sugimae et al. | |
| 6,955,961 B1 * | 10/2005 | Chung | H01L 21/0337 257/E21.038 |
| 7,291,560 B2 | 11/2007 | Parascandola et al. | |
| 7,495,294 B2 | 2/2009 | Higashitani | |
| 7,951,669 B2 | 5/2011 | Harari et al. | |
| 7,985,682 B2 | 7/2011 | Matsuzaki | |
| 8,158,333 B2 | 4/2012 | Hashimoto | |
| 8,194,470 B2 | 6/2012 | Higashitani | |
| 8,216,947 B2 * | 7/2012 | Lee | H01L 21/0332 438/267 |
| 8,227,354 B2 | 7/2012 | Kim et al. | |
| 8,310,055 B2 * | 11/2012 | Park | H01L 21/0337 257/734 |
| 8,420,540 B2 * | 4/2013 | Lam | H01L 21/0337 257/E21.214 |
| 8,557,704 B2 | 10/2013 | Wells et al. | |
| 8,835,321 B2 * | 9/2014 | Ha | H01L 21/0337 438/696 |
| 8,932,955 B1 * | 1/2015 | Sel | H01L 21/308 438/694 |
| 9,099,532 B2 * | 8/2015 | Sel | H01L 21/0337 |
| 9,224,744 B1 * | 12/2015 | Yokota | H01L 21/0337 |
| 2006/0216938 A1 | 9/2006 | Miyagawa et al. | |
| 2006/0234166 A1 | 10/2006 | Lee et al. | |
| 2007/0026684 A1 | 2/2007 | Parascandola et al. | |
| 2008/0131793 A1 | 6/2008 | Lee et al. | |
| 2009/0154240 A1 * | 6/2009 | Park | G11C 5/063 365/185.05 |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Andres Munoz
(74) *Attorney, Agent, or Firm* — Davis Wright Tremaine LLP

(57) ABSTRACT

Sidewall spacers formed on sides of mandrels are separated by first gaps in a first region and separated by wider second gaps in a second region. The second gaps are filled while a capping layer caps the first gaps. The capping layer is etched thereby exposing mandrels in the first region, which are removed. An underlying layer is patterned using the sidewall spacers separated by first gaps to form word lines in the first region and using sidewall spacers with filled second gaps to form select lines in the second region.

20 Claims, 8 Drawing Sheets

(56) References Cited

U.S. PATENT DOCUMENTS

| | | | |
|---|---|---|---|
| 2009/0263749 A1* | 10/2009 | Sim | H01L 21/0337 430/319 |
| 2010/0120247 A1 | 5/2010 | Park | |
| 2010/0155813 A1 | 6/2010 | Murata et al. | |
| 2010/0173492 A1* | 7/2010 | Kim | H01L 21/0337 438/689 |
| 2011/0104899 A1 | 5/2011 | Lam et al. | |
| 2012/0085733 A1 | 4/2012 | Mebarki et al. | |
| 2012/0156866 A1* | 6/2012 | Ahn | H01L 21/0337 438/585 |
| 2012/0168841 A1 | 7/2012 | Chen et al. | |
| 2012/0208361 A1 | 8/2012 | Ha | |
| 2013/0065397 A1 | 3/2013 | Chen | |
| 2014/0080299 A1 | 3/2014 | Sel et al. | |

OTHER PUBLICATIONS

Chen et al., "Self-Aligned Triple Patterning to Extend Optical Lithography for 1x Patterning," International Symposium on Lithography Extensions, Oct. 21, 2010, 20 pages.

* cited by examiner

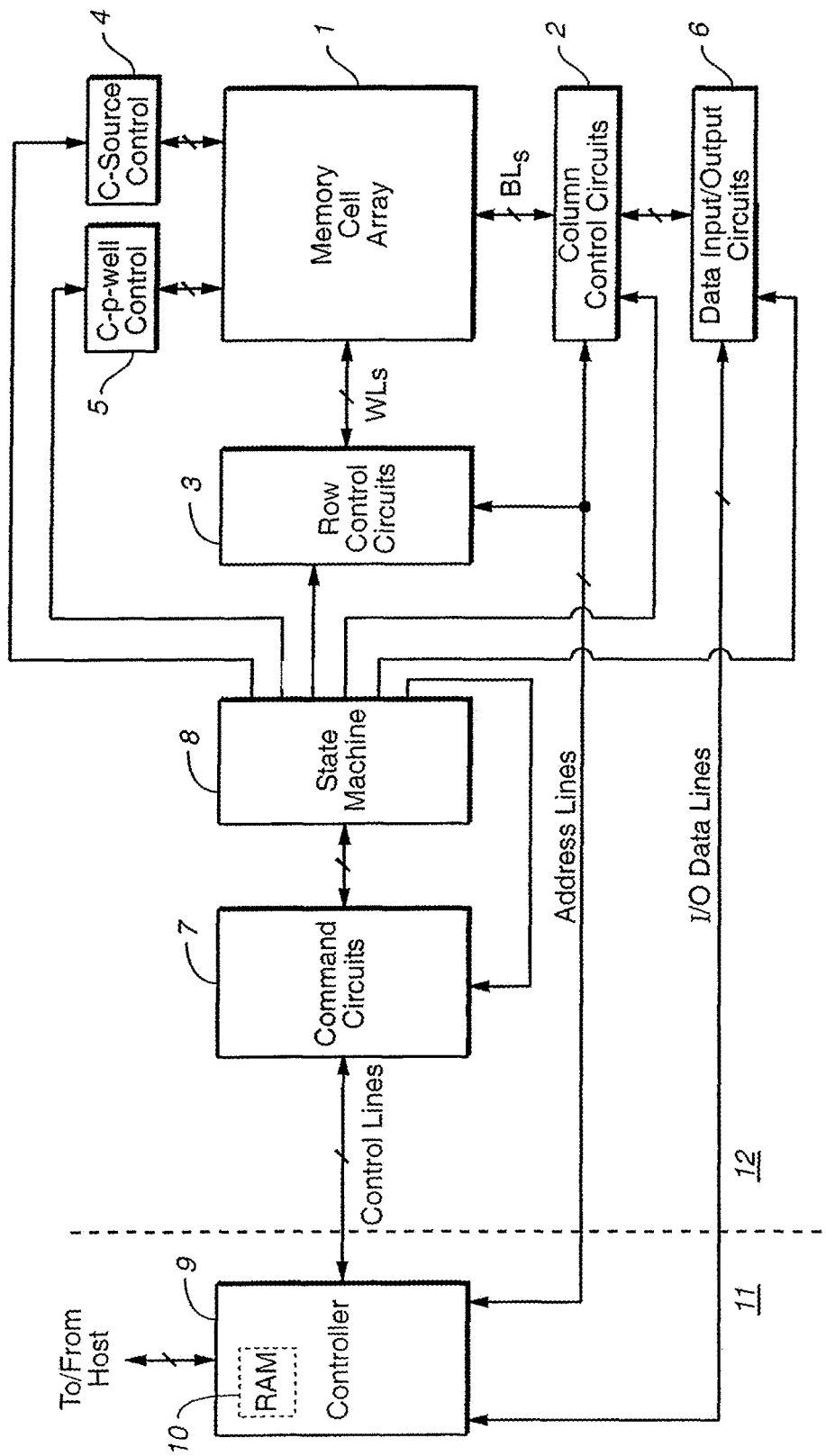
FIG._1
*(Prior Art)*

(Section A-A)

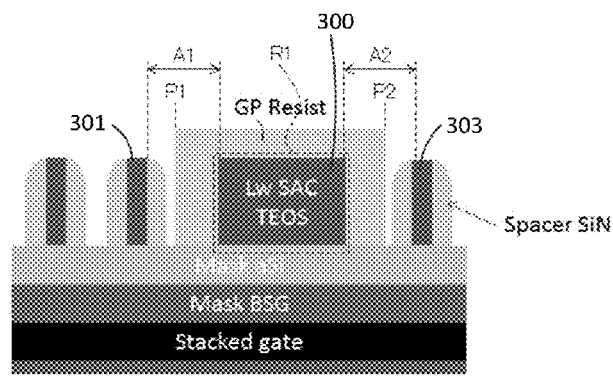
FIG. 3
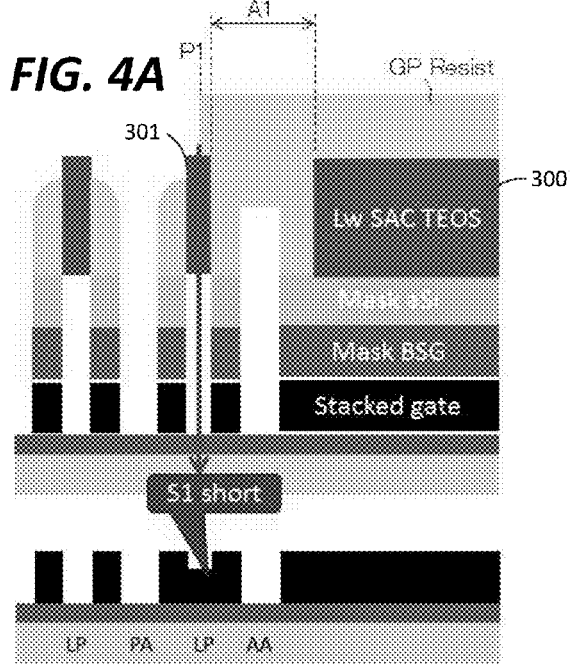
FIG. 4A
FIG. 4B
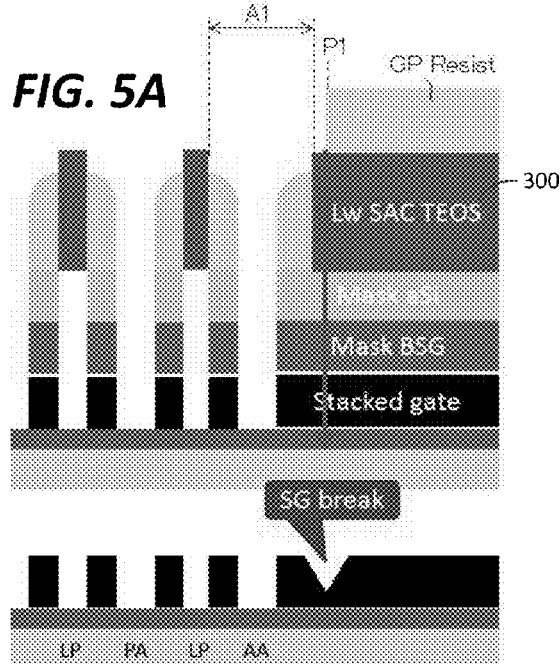
FIG. 5A
FIG. 5B

PROCESS FOR FORMING WIDE AND NARROW CONDUCTIVE LINES

BACKGROUND

This application relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors are used to connect NAND strings to control circuits when they are to be accessed, and to isolate them when they are not being accessed. Select transistors may be larger than the transistors that form nonvolatile memory cells and select lines may be wider than word lines. In general, it is desirable to form both word lines (which are relatively narrow) and select lines (which are relatively wide) in the same layer or layers using a common pattern.

Thus, there is a need for a memory chip manufacturing process that forms both wide and narrow conductive lines in a common pattern in an efficient manner.

SUMMARY

In some nonvolatile memories it is desirable to form very narrow structures such as word lines and underlying memory cells using the same pattern that is used to form wider select lines and underlying select transistors. This presents certain problems when narrow structures are formed using sidewall spacers, which tend to have uniform width. An additional patterning step may be used to form select lines. However, alignment of such select line patterning may be critical and may be difficult where dimensions are very small.

A pattern of mandrels may be formed with narrow gaps in areas where word lines are to be formed and wider gaps where select lines are to be formed. Sidewall spacers are formed along sides of mandrels. Then, a capping layer is formed that overlies narrow gaps while leaving wider gaps open. The open wider gaps are then filled and a protective portion is formed over the area where select lines are to be formed. The alignment of the protective portion is not critical and the process can tolerate a relatively large misalignment. Capping layer material and mandrels are removed by isotropic etching that may extend under the protective portion and is not limited by the protective portion. Subsequently, the protective portion is removed and the resulting pattern is transferred and used to establish word lines and select lines.

A method of forming a semiconductor device including a first line pattern and a second line pattern includes: forming a first layer of a first material; forming a plurality of core portions of a second material on an upper surface of the first layer; forming a plurality of spacers of a third material along sides of the core portions, the plurality of spacers including first pairs of spacers in a first region corresponding to the first line pattern, a first pair of spacers separated by a first distance, the plurality of spacers also including second pairs of spacers that are formed in a second region corresponding to the second line pattern, a second pair of spacers separated by a second distance that is greater than the first distance; depositing a layer of a capping material that caps first gaps between first pairs of spacers and does not cap second gaps between second pairs of spacers; depositing the third material to fill the second gaps; etching back the third material such that third material deposited on the capping layer is removed and third material remains in the second gaps; forming masking portions that cover the third material remaining in the second gaps; subsequently, performing isotropic etching thereby removing the capping material that caps first gaps between first pairs of spacers and removing core portions between the first pairs of spacers in the first region; subsequently, removing the masking portions; and subsequently, patterning the first layer by anisotropic etching to form the first line pattern in the first region and to form the second line pattern in the second region, the second line pattern being wider than the first line pattern.

The masking portions may extend over one or more first pairs of spacers in the first region and the isotropic etching may remove capping material under the masking portions in the first region and may remove core portions between the one or more first pairs of spacers under the masking portions. The method may include, prior to depositing the third material to fill the second gaps, performing isotropic etching to remove capping material from the second gaps. The masking portions may be formed of resist and the masking portions may extend to cover the second region and to cover a portion of the first region. The first line pattern in the first region may consist of an odd number of lines. The first material may be silicon; the second material may be silicon oxide; and the third material may be silicon nitride. The first pair of spacers separated by the first distance may be formed on opposing sides of first and second core portions, the first and second core portions having a width that is approximately equal to the first distance. The first and second core portions may be patterned by photolithographic patterning followed by slimming to reduce the width below a dimension resulting from the photolithographic patterning. The capping material may be formed by a plasma Chemical Vapor Deposition (CVD) process that uses silane (SiH4) to provide a high growth rate at tops of spacers such that first gaps are pinched off.

An example of a method of forming narrow and wide lines includes: forming a plurality of sidewall spacers on sides of mandrels, the sidewall spacers separated by first gaps in a first region and separated by second gaps in a second region, the second gaps being wider than the first gaps; forming a capping layer that caps the first gaps; subsequently, filling the second gaps while the capping layer caps the first gaps; subsequently, etching the capping layer thereby exposing mandrels in the first region; removing the mandrels in the first region; and subsequently, patterning an underlying layer using the sidewall spacers separated by first gaps to form word lines in the first region and using sidewall spacers with filled second gaps to form select lines in the second region.

Mandrels in the first region may have a dimension along the bit line direction that is equal to a width of the first gaps along the bit line direction. The capping layer may be removed from the second gaps prior to the filling of the second gaps. Protective portions may be formed to cover the filled second gaps and mandrels in the second region during the etching of the capping layer. The protective portions may extend to partially overlie the capping layer in the first region and the etching may be isotropic etching that undercuts the protective portions in the first region to expose mandrels located under the protective portions in the first region. The etching of the capping layer and the removing of the mandrels may be performed in a combined etch step. The second gaps may be filled with a material that is the same as material of the sidewall spacers thereby forming a continuous portion of the material that includes two sidewall spacers and a volume extending between the two sidewall spacers. The material may be silicon nitride and the combined etch step may use an etch chemistry that etches silicon nitride at a low rate. The mandrels may be formed of silicon oxide, the capping layer may be formed of silicon oxide, and the combined etch step uses an etch chemistry that etches silicon oxide at a high rate.

An example of a method of forming narrow and wide lines includes: forming a plurality of mandrels spaced apart by a first spacing in a first region and spaced apart by a second spacing in a second region; subsequently, forming a plurality of sidewall spacers on sides of the plurality of mandrels, the sidewall spacers separated by first gaps in the first region and separated by second gaps in a second region, the second gaps being wider than the first gaps; subsequently, forming a capping layer that caps the first gaps without capping the second gaps; subsequently, removing the capping layer material from the second gaps; subsequently, filling the second gaps while the capping layer caps the first gaps; subsequently, etching the capping layer and the mandrels in the first region while maintaining the mandrels in the second region; and subsequently, patterning an underlying layer using the sidewall spacers separated by the first gaps to form word lines in the first region and using the sidewall spacers with filled second gaps to form select line structures in the second region.

Etching the capping layer and the mandrels in the first region while maintaining the mandrels in the second region may include protecting the mandrels in the second region with protective material and using isotropic etching to etch under the protective material in the first region.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.
FIG. 3 shows an example of a pattern for forming wide and narrow lines.
FIGS. 4A-B shows an example of misalignment causing a word line to word line short.
FIGS. 5A-B shows an example of misalignment causing select line failure.

DETAILED DESCRIPTION OF EXEMPLARY EMBODIMENTS

Memory System

Figure 2A:
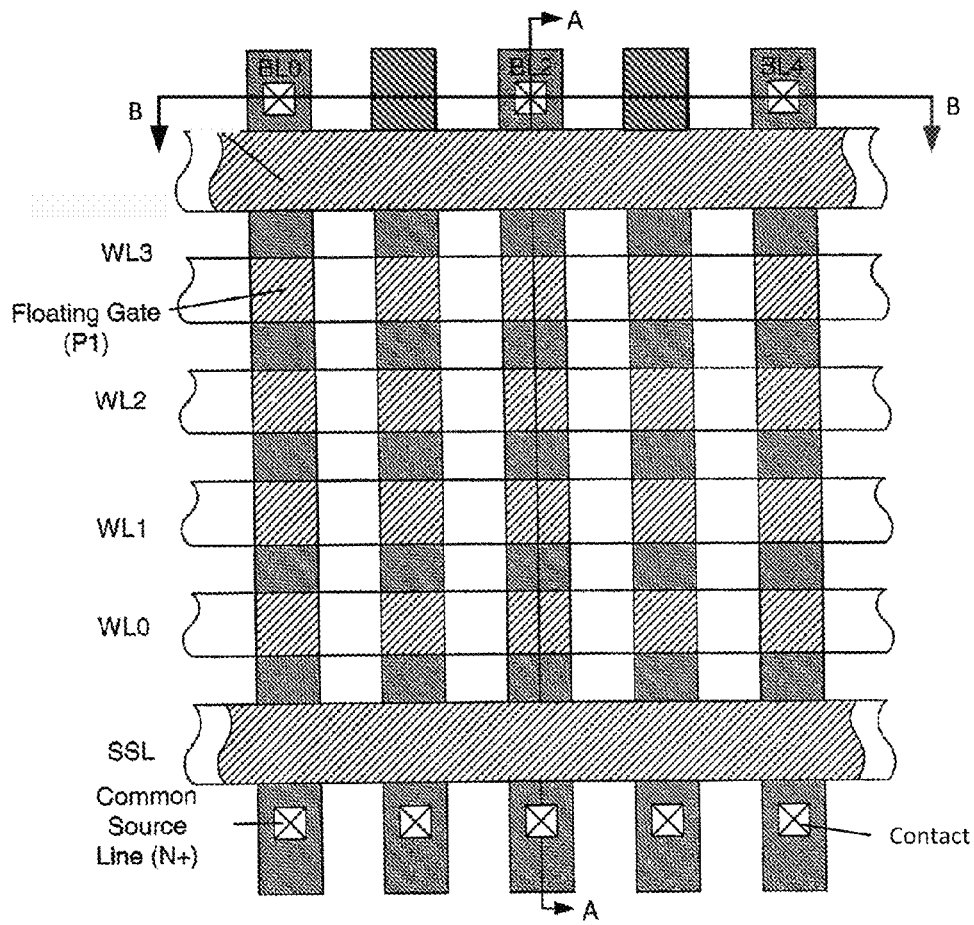
FIG. 2A is a plan view of a prior art NAND array.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (I.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

An example of a prior art memory system, which may be modified to include various structures described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Figure 2B:
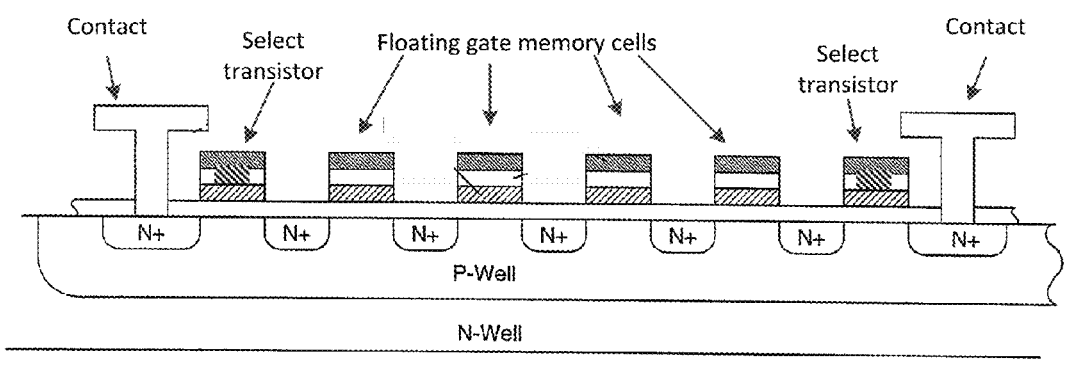
FIG. 2B shows a cross section of the NAND array of FIG. 2A.

FIGS. 2A-2B show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series with select transistors at each end of the NAND string.

In some cases, it is desirable to form select lines and select transistors with larger dimensions than word lines and memory cell transistors. For example, larger select transistors may provide better isolation of unselected NAND strings than smaller transistors would. Forming such lines and transistors with different dimensions presents some problems particularly when forming word lines and memory cells with very small dimensions. It will be understood that word lines and underlying memory cell transistors are generally formed in a common series of process steps in which a stack of layers is etched to form word lines that are self-aligned with memory cells. Similarly, select lines are generally self-aligned with select transistors and may be formed in the same etch step that forms word lines and memory cells, using a common pattern that has narrow pattern elements for word lines and wide pattern elements for select lines.

In some cases, word lines and memory transistors are formed using sidewall spacers that allow minimum dimensions that are smaller than would be achievable using direct patterning by photolithography. However, sidewall spacers are generally formed with a uniform width (which may be equal to word line width) and forming wider conductive lines (such as select lines) may require additional patterning. Such additional patterning presents various problems.

FIG. 3 shows an example of a portion of a nonvolatile integrated circuit at an intermediate stage of fabrication. A stacked gate that may include gate dielectric, floating gate polysilicon, inter-poly dielectric, control gate polysilicon and/or other materials extends over a substrate. Mask layers of borosilicate glass ("Mask BSG") and amorphous silicon ("aSi") extend over the stacked gate layer. A pattern of mandrels and sidewall spacers is shown on the upper surface of the mask layer. Mandrels are formed of sacrificial silicon oxide deposited using tetraethyl orthosilicate ("SAC TEOS"). A wide mandrel 300 is shown in region RI where select lines are to be formed. Narrow mandrels 301, 303 are shown on either side where word lines are to be formed. A portion of photoresist ("GP Resist") overlies wide mandrel 300 to protect the wide mandrel during removal of narrow mandrels so that a wide line pattern may be formed by the wide mandrel and sidewall spacers along its sides and narrow line patterns may be formed by sidewall spacers alone (without any mandrel material). The wide mandrel is spaced from the nearest narrow mandrels 301, 303 by spaces A1 and A2. Edges of the photoresist portion, shown at locations P1 and P2 must lie within the spaces A1 and A2 in order to protect the wide mandrel without affecting removal of narrow mandrels. As dimensions get smaller, aligning the photoresist portion accurately so that its edges are in the required locations becomes more difficult.

FIG. 4A shows an example where a resist portion "GP resist" extends too far on one side so that the edge, P1, lies outside space A1 and overlies narrow mandrel 301. Because narrow mandrel 301 is at least partially covered by photoresist narrow mandrel 301 is not entirely removed during selective etching of mandrel material. Subsequently, as shown in FIG. 4B, when sidewall spacers are used to pattern underlying layers to form word lines, the remaining mandrel material may act as an unwanted pattern element that causes word lines to be shorted together "S 11 short" so that they cannot be separately biased, which may cause the word lines, or the block containing the word lines to be inoperable.

FIG. 5A shows another example where a resist portion does not extend far enough on one side so that the edge, P1, lies outside space A1 and overlies wide mandrel 300. In this case, the wide mandrel 300 is exposed to etching during removal of narrow mandrels. This may cause an opening in the mandrel material. When the wide mandrel (with sidewall spacers) is used as an etch mask such an opening may result in a break in a select line ("SG break") as shown in FIG. 5B. Even if the select line is not completely broken (i.e. even if there is sufficient select line material to provide an electrical connection) there may be a significant increase in resistance which may cause significant RC delay and may make the select line inoperable. It can be seen from the examples of FIGS. 4A-B and 5A-B that precise alignment of protective photoresist with the previously formed mandrel/sidewall structure is critical. As memory array dimensions get smaller, such precise alignment becomes harder to achieve, and more expensive to achieve.

Figure 6:
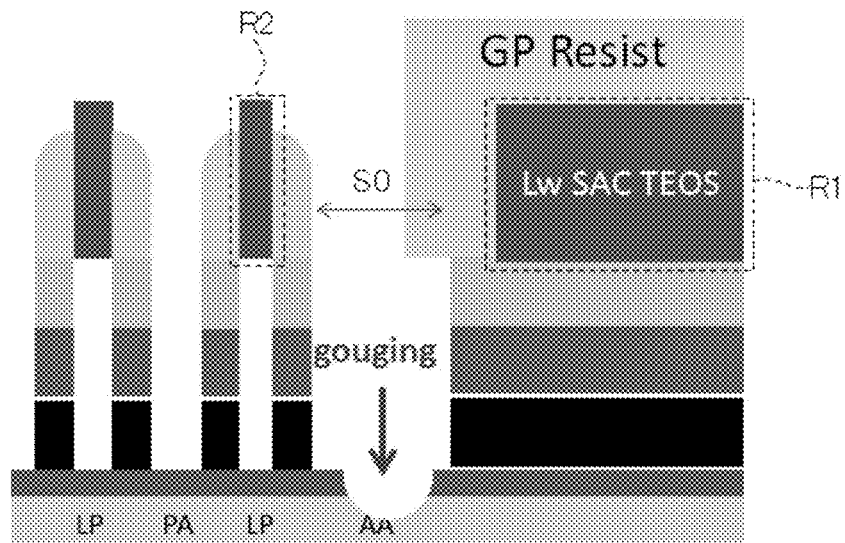
FIG. 6 shows an example of a wide word line to select line gap causing gouging.

One way to increase tolerance of misalignment is to increase the spaces at either side of the wide mandrel. Thus, spaces A1 and A2 may be made wider so that a wider range of locations for edges P1 and P2 are acceptable. However, such a wider opening may result in damage to the substrate that is exposed in the wide gaps. In general, mandrel removal may use a selective etch that removes mandrel material (e.g. silicon oxide) at a rate that is significantly higher than rates of removal of other materials (e.g. silicon nitride of sidewall spacers). The selective etch may be timed to end when all mandrel material is removed. Exposed areas of the substrate that lie between sidewall spacers may experience some etching but this is not generally significant. However, where wider gaps expose larger areas of the substrate, significant damage may occur. FIG. 6 shows an example of a wide gap having a width=S0 that causes gouging of the exposed substrate. The additional exposure to etching in the wide gap is sufficient to cause significant etching at this location which gouges out an exposed area and this gouging may affect the channel of the NAND string.

Figure 7:
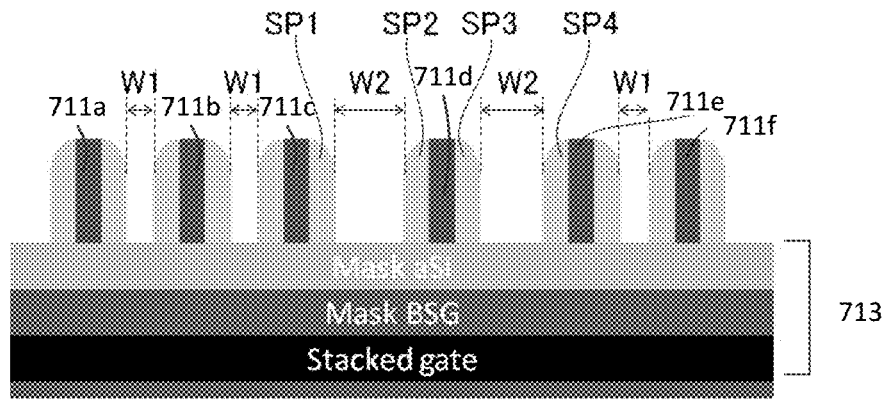
FIG. 7 shows an example of a pattern of mandrels with wide and narrow spacing.

An example of a process for forming wide and narrow pattern elements will now be described with respect to FIGS. 7-15. FIG. 7 shows an example of a portion of a NAND memory at an intermediate stage of fabrication with a pattern of mandrels 711a-f and sidewall spacers (e.g. SP1-SP4) located on an upper surface of a stack 713 that includes mask layers and stacked gate layers. All mandrels 711a-f are shown having the same width in this example. In other examples, one or more inner mandrels (located in an area corresponding to select lines) such as inner mandrel 711d may be wider than narrow mandrels (located in areas corresponding to word lines) such as narrow mandrel 711a. Spacing between sidewall spacers on neighboring mandrels is different in different regions. Spaces in word line areas have a width W1, while spaces in the central select line area have a width W2 (e.g. space between SP1 and SP2). While two spaces having width W2 are shown in the select line area, different numbers of such wide spaces may be used depending on the width of the select line to be formed, the size of the mandrel or mandrels in the select line region, and the process used.

Figure 8:
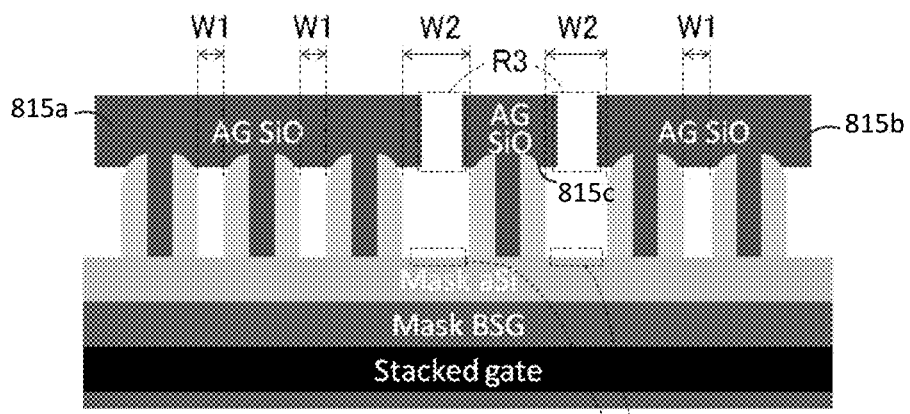
FIG. 8 shows the structure of FIG. 7 after formation of a capping layer.

FIG. 8 shows the structure of FIG. 7 after formation of a capping material to form capping layer portions 815a-b. Capping layers are generally used to cap air gaps "AG" between conductive lines (e.g. word lines) and may be formed of silicon oxide ("AG SiO"). For example, some processes use silane (SiH4) gas in a plasma Chemical Vapor Deposition (CVD) process to form silicon oxide with low coverage so that narrow spaces are plugged and capped. Wider gaps may not be plugged so that wider gaps may remain open. The maximum dimension for capping to occur (or minimum gap that remains open) depends on the process used. The capping layer forming portions 815a-b extends over narrower spaces (spaces having width W1) in the word line areas. However, the capping layer does not extend over wider spaces (spaces having width W2, indicated by R4). Thus, such a process may be considered selective to narrow gaps and the pattern formed may be considered a self-aligned pattern or mask because it aligns itself with areas having narrow gaps. Some capping layer material 815c is deposited on the inner mandrel but wide gaps on either side of the inner mandrel remain open. Some capping layer material may be deposited on an exposed area of an upper surface of the mask layer in regions R4. Such material may be removed by isotropic etching (e.g. by wet etching).

Figure 9:
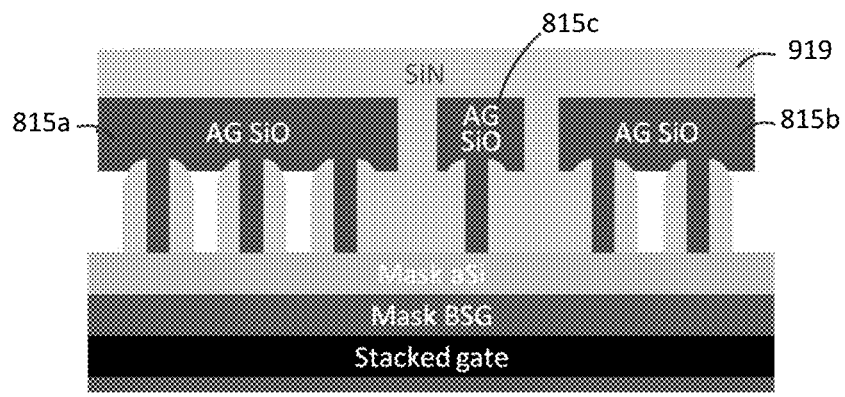
FIG. 9 shows the structure of FIG. 8 after deposition of filler material.

FIG. 9 shows the structure of FIG. 8 after deposition of a gap filling layer 919, which in this example is silicon nitride ("SiN"), the same material used to form sidewall spacers. Because wide gaps remain open after formation of the capping layer, gap filling material is deposited in these gaps and fills the gaps in addition to depositing over the capping layer portions 815a-c.

Figure 10:
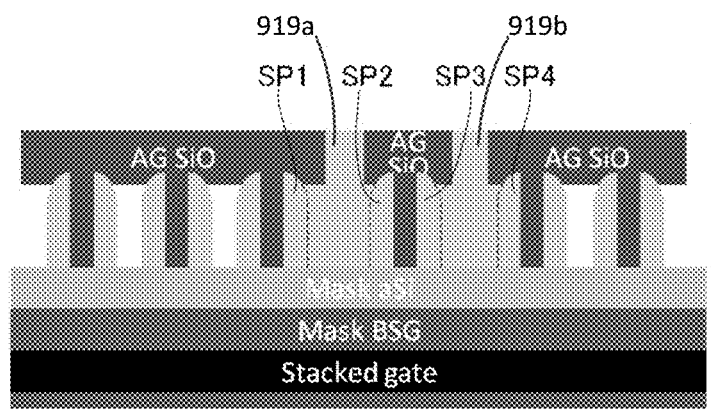
FIG. 10 shows the structure of FIG. 9 after removal of excess filler material.

FIG. 10 shows the structure of FIG. 9 after removal of excess material of gap filling layer 919. In this example, silicon nitride may be etched back using a suitable etch (e.g. Reactive Ion Etching "RIE") or planarized using Chemical Mechanical Polishing ("CMP"), or otherwise removed to expose the capping layer portions 815a-c. At this point, it can be seen that two silicon nitride structures are formed in the central area where select lines are to be formed, one silicon nitride structure consisting of spacers SP1 and SP2 joined together by a remaining portion of gap filling material 919a, and another silicon nitride structure consisting of spacers SP3 and SP4 joined together by a remaining portion of gap filling material 919b.

Figure 11:
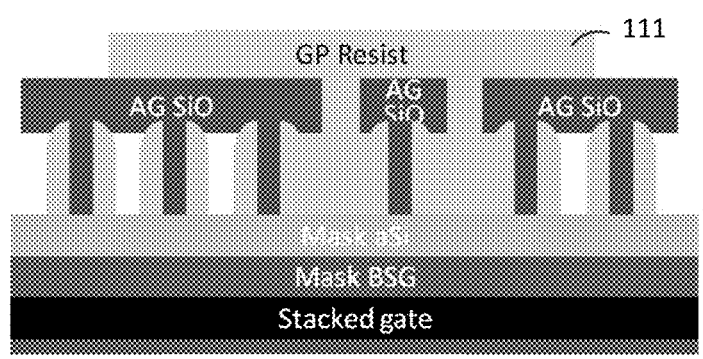
FIG. 11 shows the structure of FIG. 10 after formation of a protective portion.

FIG. 11 shows the structure of FIG. 10 after formation of a portion protective material 111 to mask the central area where select lines are to be located. The protective or masking material in this example is photoresist "GP Resist." In this case, as will be described below, alignment of the photoresist portion does not require very high precision. The process is generally tolerant of misalignment so that the process may be extended to memories with very small feature sizes and/or may use relatively imprecise alignment (which may be cheaper than more accurate alignment).

Figure 12:
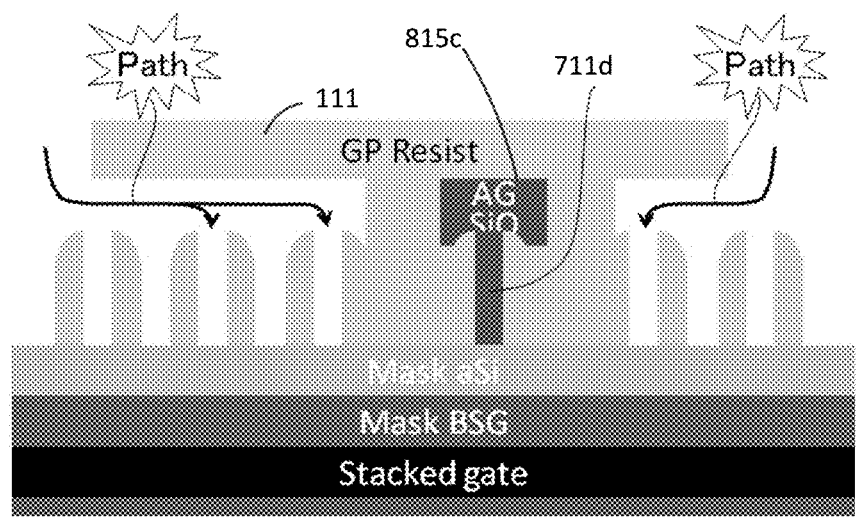
FIG. 12 shows the structure of FIG. 11 after isotropic etching.

FIG. 12 shows the structure of FIG. 11 after isotropic etching to remove capping layer portions 815a and 815b and mandrels that are exposed by the removal of capping layer portions 815a and 815b. In this example, the capping layer portions 815a and 815b and mandrels 711a-c and 711e-f are all formed of silicon oxide so that a single etch step may be used to remove both.

In other examples, different materials may be used and different etch steps may remove each material. Isotropic etching (e.g. wet etching of SiO using HF, or dry etching using HF gas or NF3) may undercut the protective portion 111 so that removal of material is not limited to the area left uncovered by the protective portion. As etching undercuts the protective portion 111, mandrels under the protective portion are exposed and subsequently removed. Thus, the selective isotropic etching proceeds to remove both capping layer material and mandrels that are located under the protective portion. However, the filling material (silicon nitride in this case) provides a barrier to isotropic etching of the inner mandrel 711d and capping layer portion 815c.

Figure 13:
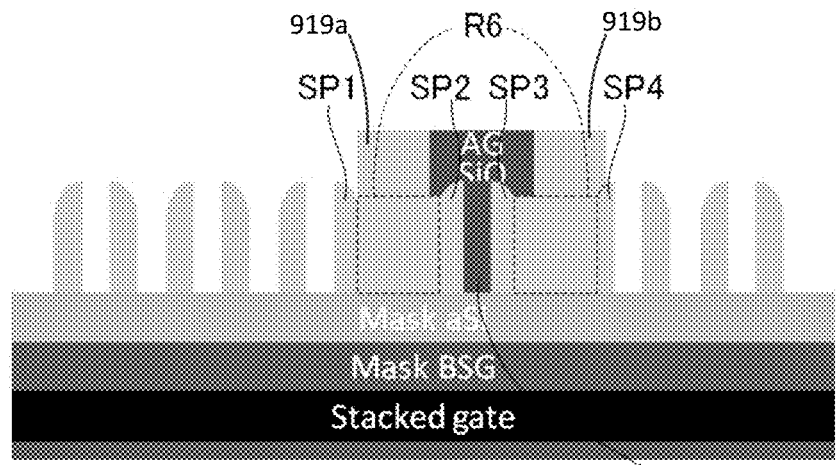
FIG. 13 shows the structure of FIG. 12 after removal of the protective portion.

FIG. 13 shows the structure of FIG. 12 after removal of the protective portion 111. In this case, the protective portion is formed of photoresist and is removed by ashing. Other materials may be removed in different ways. It can be seen that the pattern remaining in FIG. 13 includes sidewall spacers where word lines are to be formed and a large block in the central area where select lines are to be formed. The block includes an inner mandrel 711d and structures on either side of the inner mandrel, one formed by sidewall spacers SP1 and SP2 and the filler material portion 919a them, another formed by sidewall spacers SP3 and SP4 and the filler material portion 919b. Thus, the block extends from sidewall spacer SP1 to sidewall spacer SP4. Dimensions of the block are not established by the location of the protective portion 111 so that the exact positioning of protective portion 111 may not be critical (as long as inner mandrel 711d is protected). No wide spaces are present at sides of the block so that the risk of gouging of the substrate is low.

Figure 14:
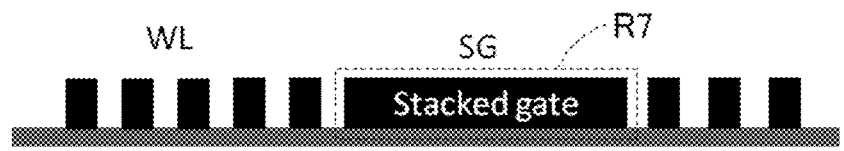
FIG. 14 shows the pattern of FIG. 13 transferred to an underlying stack.

FIG. 14 shows the pattern of FIG. 13 transferred to the stacked gate structure. Transfer may include one or more anisotropic etching steps (e.g. RIE) to transfer the pattern to mask layers and subsequently transfer the pattern to the stacked gate. It can be seen that a single wide stacked gate element is formed in region R7 while narrow word line structures "WL" are formed on either side. The stacked gate structure may include a select gate "SG" in addition to other elements.

Figure 15:
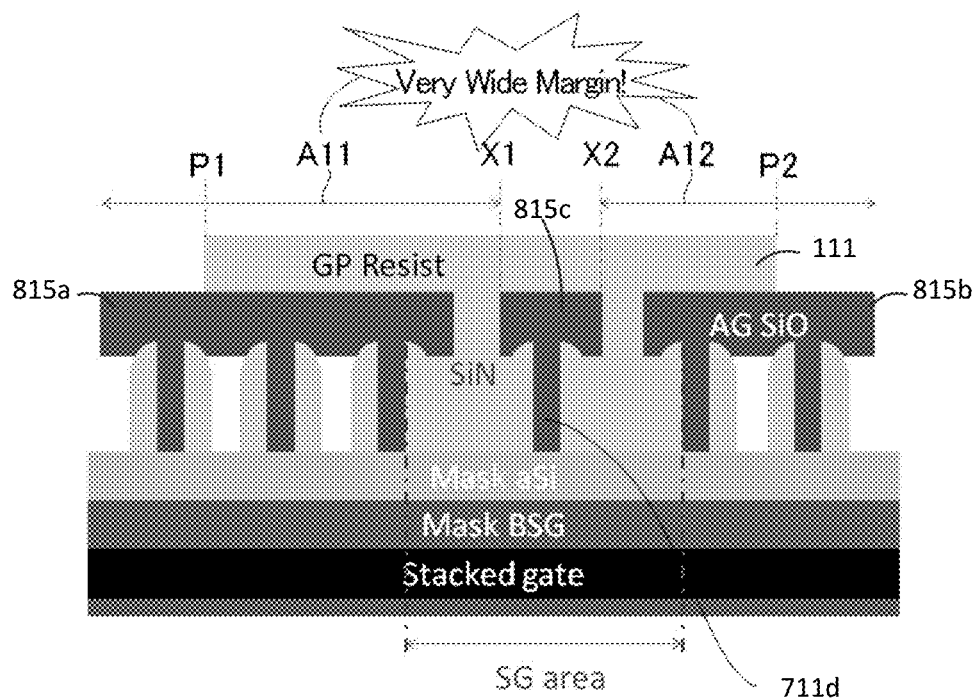
FIG. 15 illustrates alignment tolerance.

FIG. 15 illustrates how the process described above has a high tolerance for misalignment. Edges P1 and P2 of the protective portion 111 are shown some distance beyond the select gate "SG" area. While there may be an upper limit to how much the protective portion can overlap the capping layer portions 815a and 815b, some overlap as shown is generally acceptable because isotropic etching penetrates under the protective portion and selectively etches away the capping layer to expose, and etch, mandrels that are under the protective portion. Inner mandrels are protected by filler material during this etch so that they remain intact. While the example above includes a single inner mandrel 711d with two wide spaces, one on either side of the wide mandrel, other structures may be used to form wide lines. For example, a single wide space (with no inner mandrel) may be used, or two or more inner mandrels forming three or more wide spaces may be used. The mandrel size is uniform in the example above, with inner mandrels having the same lateral dimension as mandrels in the word line area. However, dimensions of inner mandrels are not generally critical so that different dimensions may be used and inner mandrels do not necessarily have the same dimensions as mandrels in the word line areas.

Figures 16A, 16B:
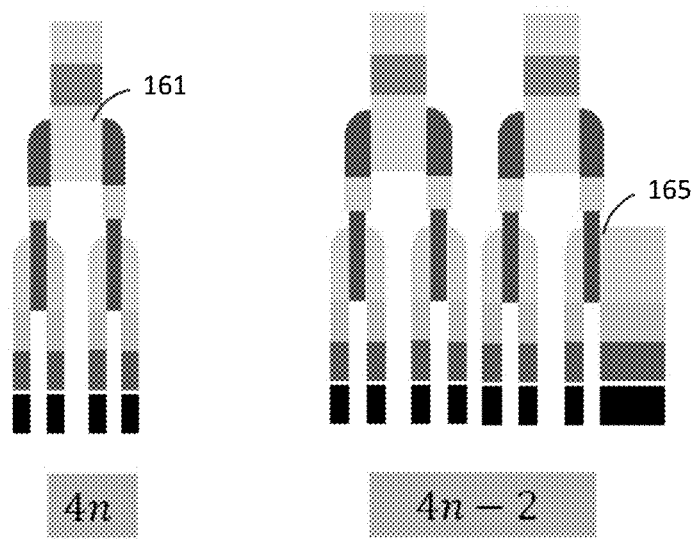
FIGS. 16A-B illustrate double sidewall assisted patterning.

FIGS. 16A-B illustrate one consequence of using the process above. FIG. 16A shows a Double Sidewall Assisted Process (DSAP) where a first mandrel 161 is used to form first sidewall spacers which are then used to pattern a lower layer into second mandrels. Second mandrels are then used to form second sidewall spacers. In this way, a single mandrel formed by photolithographic processing may produce four separate patterned portions such as word lines. Thus, the number of word lines may be four times the number of pattern portions in a lithography mask (i.e. 4n word lines generated from n lines on a mask). FIG. 16B shows a double sidewall spacer example in which, where a select line is formed, one of the second sidewall spacers (spacer 165) is consumed to establish the edge of the select line. Select lines are generally located at each end of a NAND string so that another sidewall spacer is similarly consumed at the other end of the NAND string. Thus, the number of word lines in such a pattern may be 4n−2, where n is the number of lines in the mask pattern. While a NAND string according to the example of FIG. 16A may have, for example, 16, 32, or 64 word lines intersecting a NAND string, the example of FIG. 16B may have 14, 30, or 62 word lines.

Figure 17:
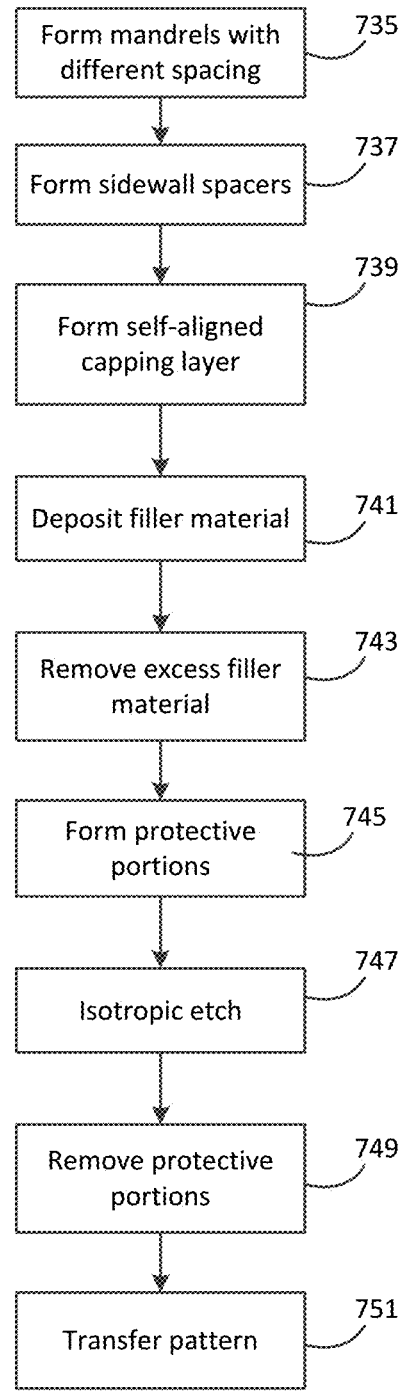
FIG. 17 shows an example of process steps forming wide and narrow lines.

FIG. 17 shows an example of process steps that may be used to form both wide lines such as select lines and narrow lines such as word lines in a single metal layer. Mandrels are formed with different spacing between mandrels 735. In particular, mandrels are more widely spaced in an area where select lines and select transistors are to be formed and one or more inner mandrel may be located in the select line area with wide spaces on either side. Subsequently, sidewall spacers are formed along sides of mandrels 737. A capping layer is then formed over the sidewall spacers and mandrels 739 so that the capping layer caps narrower gaps in the word line area but leaves gaps open in the select line area. This layer may be considered self-aligned with narrow spaces of the word line areas. If there is significant capping layer material in wide gaps then it may be removed at this stage by isotropic etching. Filler material is then deposited 741 to fill wide gaps that remained open in the select line area. The filler material may be the same material as the sidewall spacers (e.g. silicon nitride). Excess filler material is then removed 743 (e.g. by etching or CMP) so that the upper surface of the capping layer is exposed. Protective portions are then formed 745 over the select line areas so that any inner mandrels are covered. Isotropic etching is then performed 747 to remove capping layer material and exposed mandrels including capping layer material and mandrels that are under, or partially under, the protective portion. The protective portion prevents removal of any inner mandrels during this etch. Protective portions are then removed 749. Then, the pattern including wide portions formed by sidewall spacers, filler material, and any inner mandrels, along with narrow portions formed by sidewall spacers is transferred 751 to an underlying layer such as a mask layer. The pattern may subsequently be transferred to an underlying stack to form select lines and word lines.

CONCLUSION

Although the various aspects have been described with respect to examples, it will be understood that protection within the full scope of the appended claims is appropriate.

The invention claimed is:

1. A method of forming a semiconductor device including a first line pattern and a second line pattern comprising:
    forming a first layer of a first material;
    forming a plurality of core portions of a second material on an upper surface of the first layer,
    forming a plurality of spacers of a third material along sides of the plurality of core portions, the plurality of spacers including first pairs of spacers in a first region corresponding to the first line pattern, a first pair of spacers separated by a first distance, the plurality of spacers also including second pairs of spacers that are formed in a second region corresponding to the second line pattern, a second pair of spacers separated by a second distance that is greater than the first distance;
    depositing a layer of a capping material that caps first gaps between the first pairs of spacers and does not cap second gaps between the second pairs of spacers;
    depositing the third material to fill the second gaps;
    etching back the third material such that the third material deposited on the capping material is removed and the third material remains in the second gaps;
    forming masking portions that cover the third material remaining in the second gaps;
    subsequently, performing isotropic etching thereby removing the capping material that caps the first gaps between the first pairs of spacers and removing core portions between the first pairs of spacers in the first region;
    subsequently, removing the masking portions; and
    subsequently, patterning the first layer by anisotropic etching to form the first line pattern in the first region and to form the second line pattern in the second region, the second line pattern being wider than the first line pattern.

2. The method of claim 1 wherein the masking portions extend over one or more first pairs of spacers in the first region and the isotropic etching removes the capping material under the masking portions in the first region and removes core portions between the one or more first pairs of spacers under the masking portions.

3. The method of claim 1, the method further comprising, prior to depositing the third material to fill the second gaps, performing isotropic etching to remove the capping material from the second gaps.

4. The method of claim 1, wherein the masking portions are formed of resist and the masking portions extend to cover the second region and to cover a portion of the first region.

5. The method of claim 1 wherein the first line pattern in the first region consists of an odd number of lines.

6. The method of claim 1 wherein:
    the first material is silicon;
    the second material is silicon oxide; and
    the third material is silicon nitride.

7. The method of claim 1 wherein the first pair of spacers separated by the first distance are formed on opposing sides of first and second core portions, the first and second core portions having a width that is approximately equal to the first distance.

8. The method of claim 7 wherein the first and second core portions are patterned by photolithographic patterning followed by slimming to reduce the width below a dimension resulting from the photolithographic patterning.

9. The method of claim 1 wherein the capping material is formed by a plasma Chemical Vapor Deposition (CVD) process that uses silane ($SiH_4$) to provide a high growth rate at tops of the first spacers such that first gaps are pinched off.

10. A method of forming narrow and wide lines comprising:
forming a plurality of sidewall spacers on sides of mandrels, the plurality of sidewall spacers separated by first gaps in a first region and separated by second gaps in a second region, the second gaps being wider than the first gaps;
forming a capping layer that caps the first gaps;
subsequently, filling the second gaps while the capping layer caps the first gaps;
subsequently, etching the capping layer thereby exposing mandrels in the first region;
removing the mandrels in the first region; and
subsequently, patterning an underlying layer using the plurality of sidewall spacers separated by the first gaps to form word lines in the first region and using sidewall spacers with filled second gaps to form select lines in the second region.

11. The method of claim 10 wherein mandrels in the first region have a dimension along the bit line direction that is equal to a width of the first gaps along bit line direction.

12. The method of claim 10 wherein the capping layer is removed from the second gaps prior to the filling of the second gaps.

13. The method of claim 10 further comprising forming protective portions to cover the filled second gaps and mandrels in the second region during the etching of the capping layer.

14. The method of claim 13 wherein the protective portions extend to partially overlie the capping layer in the first region and wherein the etching is isotropic etching that undercuts the protective portions in the first region to expose mandrels located under the protective portions in the first region.

15. The method of claim 14 wherein the etching the capping layer and the removing the mandrels are performed in a combined etch step.

16. The method of claim 15 wherein the second gaps are filled with a material that is the same as a material of the plurality of sidewall spacers thereby forming a continuous portion of the material that includes two sidewall spacers and a volume extending between the two sidewall spacers.

17. The method of claim 16 wherein the material is silicon nitride and the combined etch step uses an etch chemistry that etches silicon nitride at a low rate.

18. The method of claim 17 wherein the mandrels are formed of silicon oxide, the capping layer is formed of silicon oxide, and the combined etch step uses an etch chemistry that etches silicon oxide at a high rate.

19. A method of forming narrow and wide lines comprising:
forming a plurality of mandrels spaced apart by a first spacing in a first region and spaced apart by a second spacing in a second region;
subsequently, forming a plurality of sidewall spacers on sides of the plurality of mandrels, the sidewall spacers separated by first gaps in the first region and separated by second gaps in the second region, the second gaps being wider than the first gaps;
subsequently, forming a capping layer that caps the first gaps without capping the second gaps;
subsequently, removing the capping layer from the second gaps;
subsequently, filling the second gaps while the capping layer caps the first gaps;
subsequently, etching the capping layer and the plurality of mandrels in the first region while maintaining the plurality of mandrels in the second region; and
subsequently, patterning an underlying layer using the plurality of sidewall spacers separated by the first gaps to form word lines in the first region and using the plurality of sidewall spacers with filled second gaps to form select line structures in the second region.

20. The method of claim 19 wherein etching the capping layer and the plurality of mandrels in the first region while maintaining the plurality of mandrels in the second region includes protecting the plurality of mandrels in the second region with a protective material and using isotropic etching to etch under the protective material in the first region.

* * * * *